(12) United States Patent
Merrill

(10) Patent No.: US 6,750,489 B1
(45) Date of Patent: Jun. 15, 2004

(54) ISOLATED HIGH VOLTAGE PMOS TRANSISTOR

(75) Inventor: Richard B. Merrill, Woodside, CA (US)

(73) Assignee: Foveon, Inc., Santa Clara, CA (US)

( * ) Notice: Subject to any disclaimer, the term of this patent is extended or adjusted under 35 U.S.C. 154(b) by 33 days.

(21) Appl. No.: 10/280,390

(22) Filed: Oct. 25, 2002

(51) Int. Cl.[7] ............................................. H01L 31/062
(52) U.S. Cl. .................. 257/292; 257/336; 257/337; 257/344; 257/355; 257/356; 257/357
(58) Field of Search ................. 257/336, 337, 257/344, 355, 356, 357

(56) References Cited

U.S. PATENT DOCUMENTS

| | | | |
|---|---|---|---|
| 5,055,896 A | 10/1991 | Williams et al. | 357/23.8 |
| 5,317,180 A | * 5/1994 | Hutter et al. | 257/337 |
| 5,550,067 A | 8/1996 | Kuroyanagi et al. | 437/41 |
| 6,048,759 A | 4/2000 | Hshieh et al. | 438/206 |
| 6,172,401 B1 | * 1/2001 | Brand | 257/344 |
| 6,218,228 B1 | 4/2001 | Zambrano | 438/229 |
| 6,256,689 B1 | 7/2001 | Khosrowpour | 710/101 |
| 6,271,567 B1 | 8/2001 | Pozzoni et al. | 257/355 |
| 6,318,156 B1 | 11/2001 | Dutton et al. | 73/61.44 |
| 6,327,914 B1 | 12/2001 | Dutton | 73/861.356 |

* cited by examiner

*Primary Examiner*—David Nelms
*Assistant Examiner*—Mai-Huong Tran
(74) *Attorney, Agent, or Firm*—Sierra Patent Group, Ltd.

(57) ABSTRACT

An isolated high voltage p-type DMOS transistor comprises a layer of p-type semiconductor material in which a first n-well is disposed. A first annular p-type region is disposed in the first n-well. A first annular shallow trench isolation region is spaced apart from the first annular p-type region. An annular p-well region is spaced apart from the first shallow trench isolation region. An inner perimeter of the annular p-well region is disposed outside of the first annular p-type region. A second annular p-type region is disposed in the p-well. An annular gate has an inner perimeter aligned with the outer perimeter of the first annular p-type region and an outer perimeter disposed over the first shallow trench isolation region. A second annular n-well region is disposed outside of a second annular shallow trench isolation region. The second annular shallow trench isolation region is disposed outside of the annular p-well region. A third shallow trench isolation structure is disposed in the layer of p-type semiconductor layer outside of the annular second n-well structure.

7 Claims, 4 Drawing Sheets

ISOLATED HIGH VOLTAGE PMOS TRANSISTOR

BACKGROUND OF THE INVENTION

1. Field of the Invention

The present invention relates to semiconductor structures. More particularly, the present invention relates to MOS transistor structures.

2. The Prior Art

The device of the present invention is a DMOS (Double diffused Metal Oxide Semiconductor) transistor. Several techniques are known for building DMOS transistors in CMOS (Complementary Metal Oxide Semiconductor) and in BiCMOS (Bipolar CMOS) processes.

U.S. Pat. No. 6,218,228 to Zambrano teaches a lightly doped region for a DMOS transistor but it is a vertically oriented structure that is not compatible with CMOS.

U.S. Pat. No. 6,048,759 to Hshieh teaches a similar structure but does not teach lightly doped. It is also a vertical device.

U.S. Pat. No. 5,550,067 to Kuroyanagi teaches a lightly doped region but without isolation. This requires that the N-type DMOS transistors that are in the process have a lightly doped well. This limits performance of the NMOS (n-type MOS) transistors on the same die.

U.S. Pat. No. 5,317,180 to Hutter teaches a BiCMOS process but does not teach use of a lightly doped region.

U.S. Pat. No. 5,055,896 to Williams teaches a vertical device that is not CMOS compatible. Isolation is not taught or suggested.

BRIEF DESCRIPTION OF THE INVENTION

An isolated high-voltage P-type DMOS transistor comprises a layer of p-type semiconductor material in which a first n-well is disposed at an axis of symmetry. A first shallow trench isolation region is disposed in the first n-well about the axis of symmetry and forms a source for the transistor.

A first annular shallow trench isolation region is disposed in the layer of p-type semiconductor material about the axis of symmetry and spaced outwardly from an outer perimeter of the first annular p-type region, a distance between an inner perimeter of the first shallow trench isolation region and an outer perimeter of the first annular p-type region defining a channel length of the transistor.

An annular p-well region is disposed in the layer of p-type semiconductor material about the axis of symmetry and spaced outwardly from the inner perimeter of the first shallow trench isolation region. An inner perimeter of the annular p-well region is disposed outside of the inner perimeter of the first annular p-type region at a distance such that lateral diffusion of the p-well impurity begins to increase a surface impurity concentration in the layer of p-type semiconductor material at the inner periphery of the first shallow trench isolation region.

A second annular p-type region is disposed in the p-well about the axis of symmetry and outside of the outer perimeter of the first shallow trench isolation region to form the drain of the transistor. An annular gate is disposed above and insulated from the layer of p-type semiconductor material. The gate has an inner perimeter aligned with the outer perimeter of the first annular p-type region and an outer perimeter disposed over the first shallow trench isolation region.

A second annular n-well region is disposed in the layer of p-type semiconductor layer about the axis of symmetry and outside of a second annular shallow trench isolation region. The second annular n-well provides a contact to buried annular n-type contact regions which in turn contact a buried n-type semiconductor layer within the p-type semiconductor layer. The second n-well, the buried annular contacts and the n-type buried layer form a junction isolation structure of the transistor from the substrate. The second annular shallow trench isolation region is disposed in the layer of p-type semiconductor layer about the axis of symmetry and outside of the annular p-well region to form an isolation region between the potential of the drain and the isolation structure. A third shallow trench isolation structure is disposed in the layer of p-type semiconductor layer about the axis of symmetry and outside of the annular second n-well structure. The body contact for the p-type DMOS transistor is an n+ diffusion placed in the first n-well at the axis of symmetry.

According to one illustrative embodiment of the invention, the layer of p-type semiconductor material may be a semiconductor substrate. According to other illustrative embodiments of the invention, the layer of p-type semiconductor material may be an epitaxial layer disposed on a semiconductor substrate. An intervening epitaxial layer may be disposed between the substrate and the layer of p-type semiconductor material. Photodiodes may or may not be disposed in the semiconductor substrate and/or the epitaxial layers depending upon the application.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons having the benefit of this disclosure.

Figure 1:
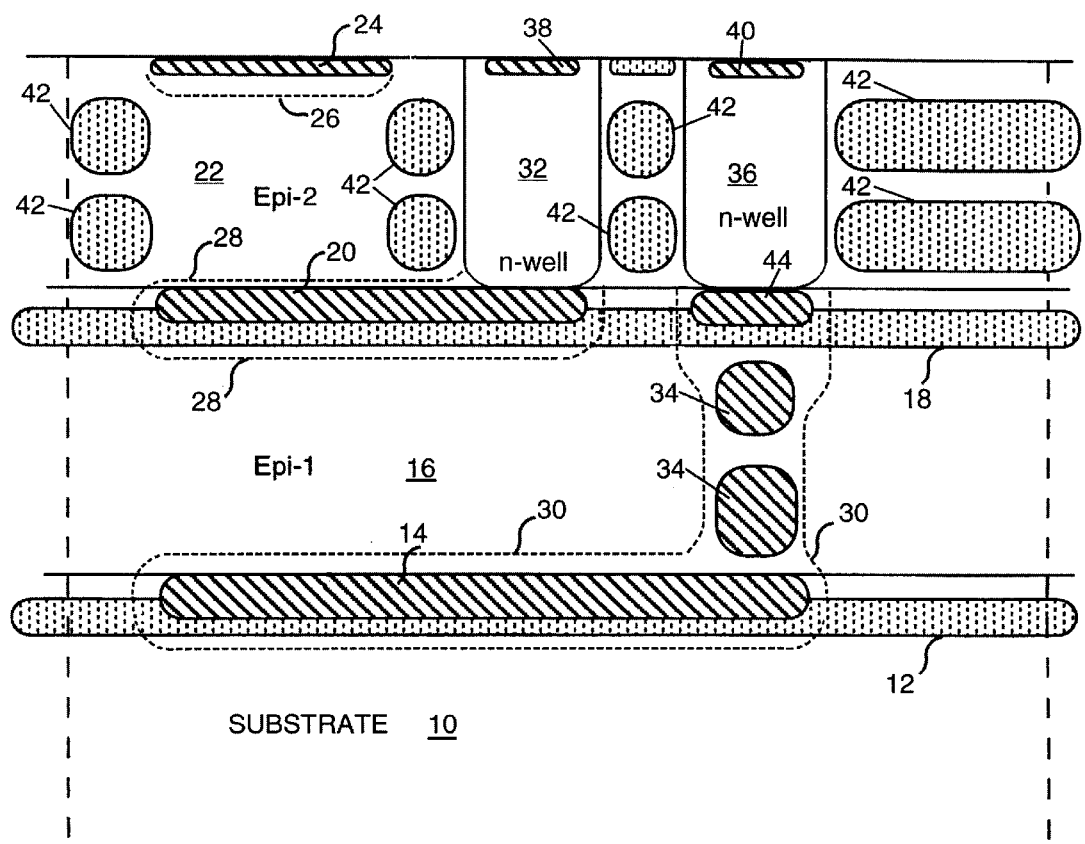
FIG. 1 is a cross-sectional diagram of a vertical color filter detector group, an exemplary environment in which the isolated high voltage pmos transistor of the present invention may be utilized.

One environment in which the isolated high voltage p-type DMOS transistor of the present invention is particularly useful in a vertical color filter detector group. Referring first to FIG. 1, a cross-sectional diagram of such a vertical color filter detector group is shown. A six-layer structure of alternating p-type and n-type regions can be formed using a p-type semiconductor substrate 10 as the bottom layer in which a blanket p-type diffusion-barrier implant 12 and a single n-type patterned diffusion 14 are disposed. The diffusion barrier 12 prevents carriers generated in the substrate from migrating upward to the green photodiode and provides isolation between the red photodiodes. The n-type patterned diffusion 14 acts as the detector for the red photodiode. In this embodiment of the invention, a first p-type epitaxial layer 16 having a blanket p-type diffusion-barrier implant 18 is disposed over the surface of the semiconductor substrate 10 and it's n-type patterned diffusion 14. The n-type patterned diffusion 20 acts as the detector for the green photodiode. A second p-type epitaxial layer 22 is disposed over the surface of the first epitaxial layer 16 and its patterned diffusion 20 and an n-type doped region 24 (which may be a lightly-doped-drain implant) is formed in the second p-type epitaxial layer 22.

Contact is made to the buried red detector 14 via deep n-type contact plugs 34. The contact plug for the buried green detector 20 is formed through second epitaxial layer 22 by n-well 32 and the contact to deep n-type contact plugs 34 is formed through second epitaxial layer 22 by n-well 36 and by an n-type region 44 that may be formed using the same mask used to form the green detector 20.

The hatched areas of FIG. 1 show the approximate locations of the implants used to create the p-type and n-type regions of the structure. The dashed line 26 defines the approximate border between the net-P and net-N doping for the blue detector 24. Similarly, the dashed line 28 defines the approximate border between the net-P and net-N doping for the green detector 20. The dashed line 30 defines the approximate border between the net-P and net-N doping for the red detector 14 with its vertical portion to the upper surface of the first epitaxial layer 16. The two regions 34 within dashed lines 30 illustrate the approximate positions of the n-type implants made in the first epitaxial layer 16 to create the deep contact plug for the red detector. N-type regions 38 and 40, respectively, are used to make contact to the n-wells that in turn contact the green and red photodiodes. P-type regions 42 act as isolation between the color sensors.

Figure 2:
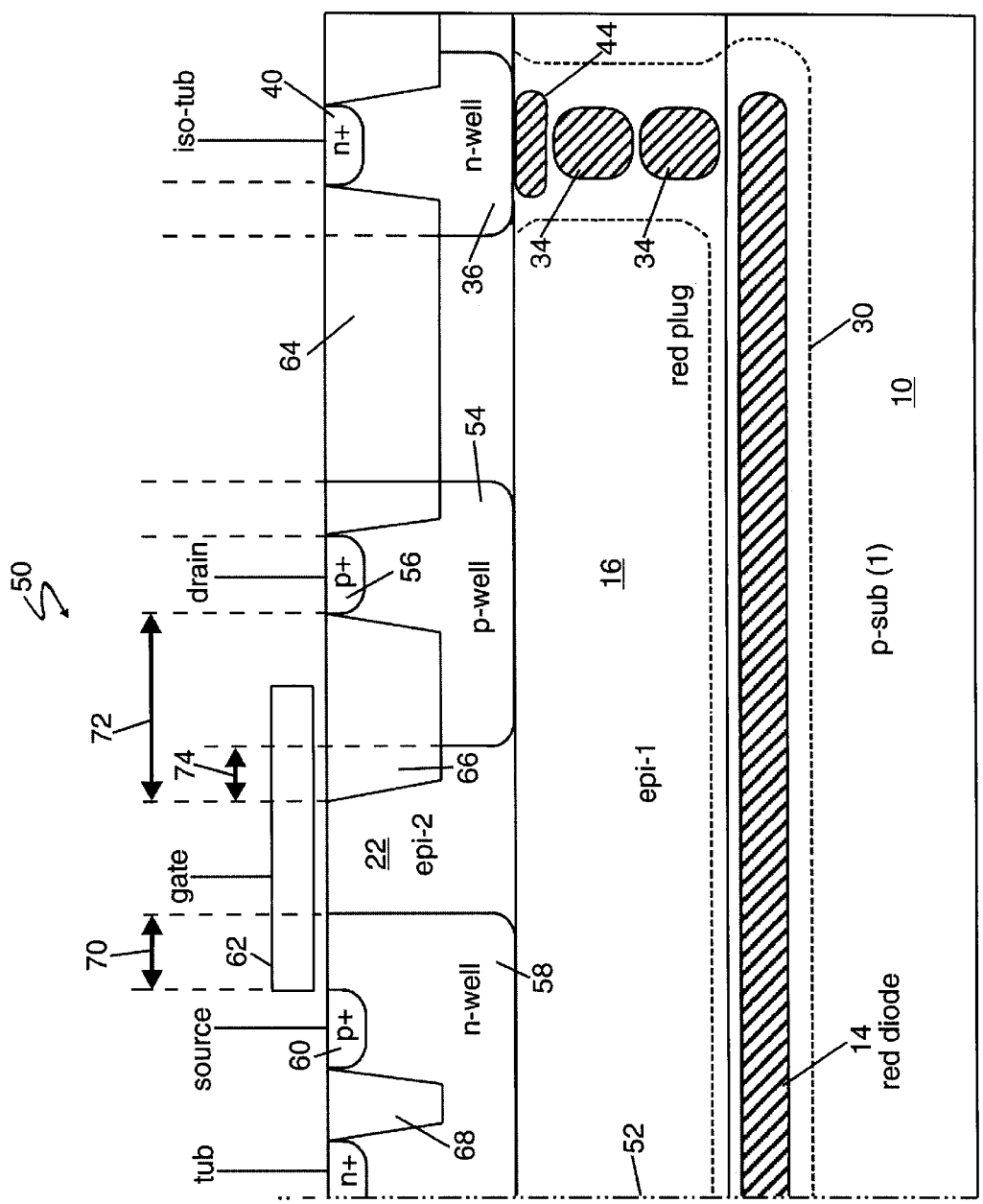
FIG. 2 is a cross-sectional diagram of an illustrative isolated high voltage p-type DMOS annular transistor according to the present invention, also showing a portion of a vertical color filter active pixel sensor.

Referring now to FIG. 2, a cross-sectional diagram of an illustrative p-type DMOS transistor 50 according to the present invention is shown. The DMOS transistor 50 of the present invention may be fabricated along with the vertical color filter detector group of the type illustrated in FIG. 1.

For an ease of understanding how the DMOS transistor 50 of the present invention may be integrated with the vertical color filter detector group of FIG. 1, a portion of an isolation structure formed using the red photodiode buried layer and it's contact plug structure is shown in FIG. 2 along with the p-type DMOS transistor of the present invention. Persons of ordinary skill in the art will appreciate that green and blue photodiodes (not shown in FIG. 2) may be disposed above the red photodiode to form a three-color vertical color-filter pixel sensor.

Thus, in FIG. 2, a p-type semiconductor substrate 10 is shown including a single patterned buried n-type diffusion 14. A first p-type epitaxial layer 16 is disposed over the surface of the semiconductor substrate 10 and the substrate buried n-type diffusion 14. An n-type region 44 provides contact between the n-well 36 and the deep n-type plugs 34. Where the present invention is used with a detector group as shown in FIG. 2 and described herein, n-type region 44 may be formed using the same mask used to form the green detector 20 (of FIG. 1). A second p-type epitaxial layer 22 is disposed over the surface of the first epitaxial layer 16 and its buried n-type region 14. Contact is made to the buried layers 14 and 20 via n-wells formed through second epitaxial layer 22 and (for layer 14) additionally through first epitaxial layer 16 by multiple implant steps. The region 34 illustrates the approximate positions of the deep n-type implants made in the first epitaxial layer 16 and the region 36 illustrates the approximate positions of the n-well implant made in the second epitaxial layer 22 to create the top portion of the deep contact plug for the buried layer. N-type region 40 is used to make contact to the deep contact plugs for the buried layer.

Persons of ordinary skill in the art will recognize that the red, green, and blue photodiodes shown in FIG. 1 are not disposed in the same plane of the figure but are laterally offset from one another. The red photodiode is nevertheless shown in FIG. 2 to facilitate understanding of how the DMOS transistor illustrated in FIG. 2 is fabricated in the process used to fabricate the vertical color filter active pixel sensor with which it may be used.

The p-type DMOS transistor 50 of the present invention is fabricated in the second epitaxial layer 22. P-type DMOS transistor 50 is formed as an annulus or topologically equivalent square or rectangular structure having an axis of symmetry about vertical line 52 at the left-hand side of FIG. 2. P-well 54 is disposed in second epitaxial layer 22. P+ region 56 is disposed in p-well 54 and forms the drain for the p-type DMOS transistor. N-well 58 is spaced apart from p-well 54 and contains p-type region 60 that serves as the source for the p-type DMOS transistor. Gate 62 is aligned with the edge of source region 60 and extends over the channel over a portion of the distance to drain region 56.

Shallow trench isolation (STI) regions 64, 66, and 68 are disposed in second epitaxial layer 22. STI region 64 is disposed between the n-well in second epitaxial layer 22 that serves as the top of the contact plug for the buried layer 14 and extends into both p-well 54 and the n-well 36. STI region 66 is disposed in the p-type DMOS transistor channel to the left of the edge of drain region 56 and extends into the channel portion of transistor 50 located in the second epitaxial layer. The well regions 36, 54, and 58 are deeper than the STI regions.

The channel length of transistor 50 is shown at reference numeral 70 and is the portion of n-well 58 under gate 62 extending from the edge of source 60 to the right-hand edge of n-well 58. Persons of ordinary skill in the art will recognize that the channel length of transistor 50 may be selected as a function of the process technology employed in the CMOS fabrication process. From the disclosure herein, such skilled persons will also recognize that epitaxial layer 22 acts as a lightly-doped-drain type dopant gradient for transistor 50.

The region of epitaxial layer 22 starting at the left-hand edge of drain region 56 and extending under STI region 66 is a drift region, the extent of which is shown in lateral projection at reference numeral 72. Persons of ordinary skill in the art will appreciate that its length (i.e., the distance from the drain 56 through p-well 54 and along the bottom and left-hand side of STI 66 in the epi region 22 between the edge of n-well 58 and STI edge 66) is proportional to the voltage to be dropped across the drain of transistor 50.

The extent to which STI region 66 extends beyond the left edge of p-well 54, shown at reference numeral 74 is selected such that lateral diffusion of the p-well 54 impurity atoms creates a surface impurity concentration in epi-2 22 at the left edge of STI region 66 that just starts to increase from the background level of the second epitaxial layer 22.

Figure 3:
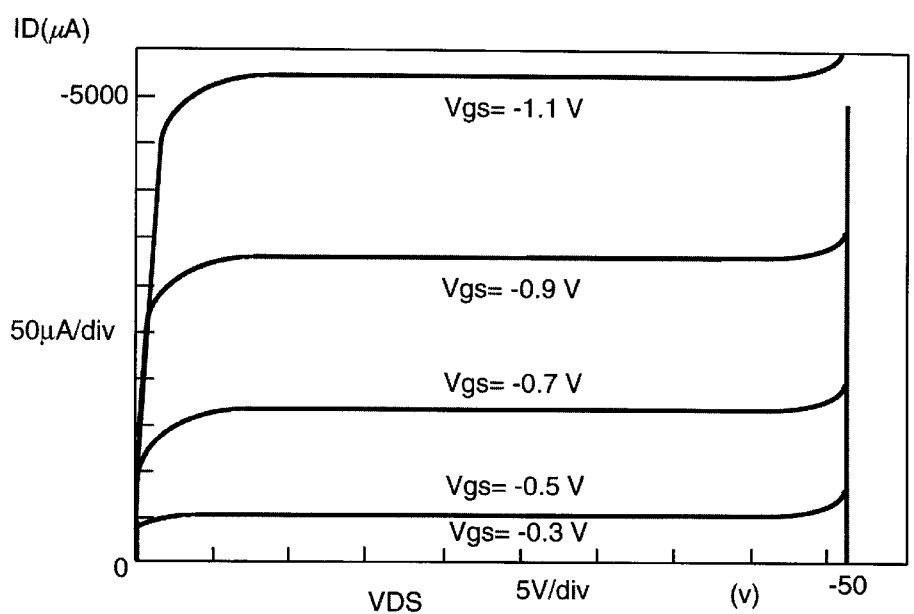
FIG. 3 is a graph showing the drain current as a function of the drain-to-source voltage characteristic of the isolated high voltage p-type DMOS transistor of FIG. 2.

FIG. 3 is a plot showing the drain current as a function of drain voltage at several different gate voltages for an experimental embodiment of the transistor 50 of the present invention.

Figure 4:
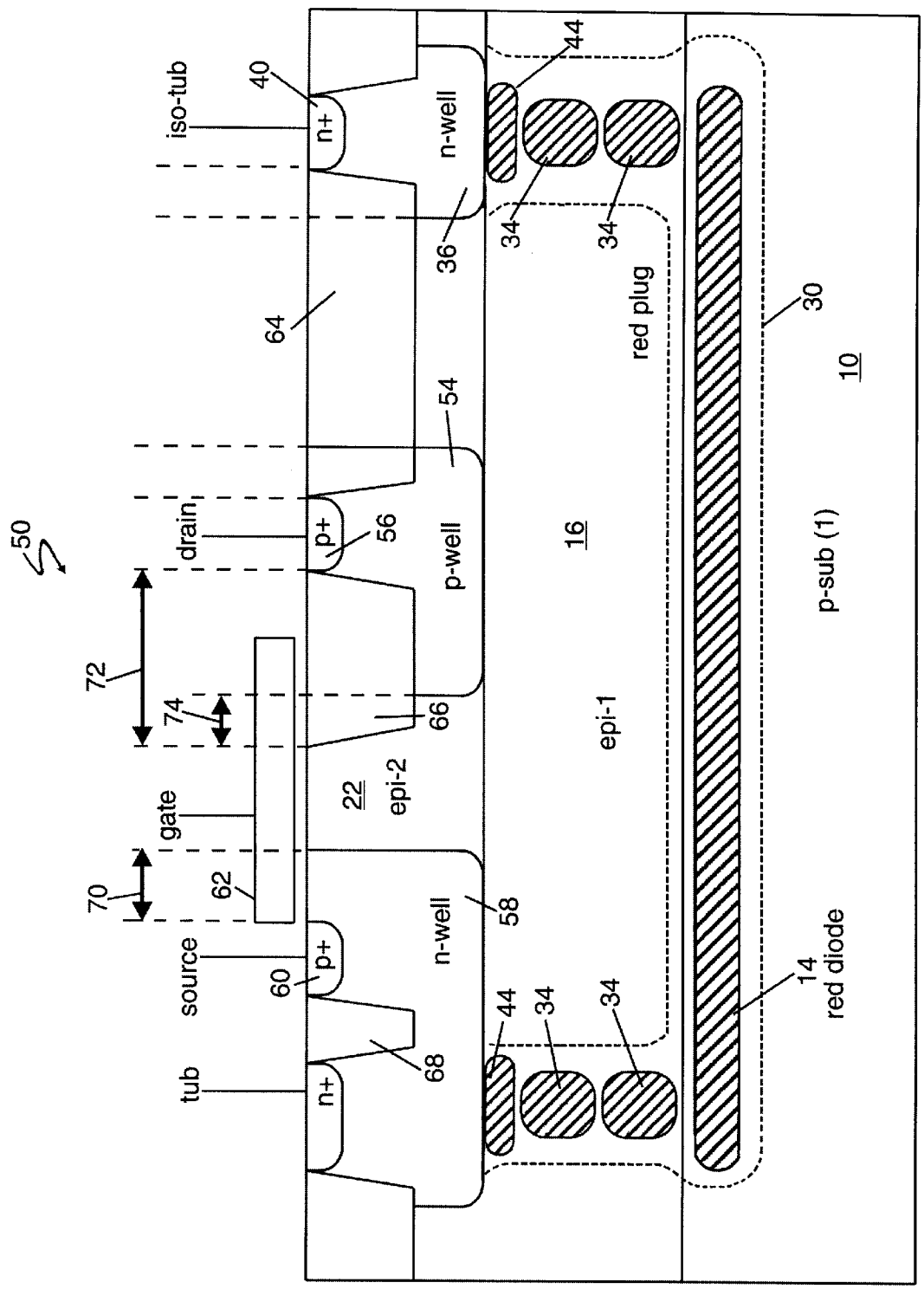
FIG. 4 is a cross-sectional diagram of an illustrative isolated high voltage p-type DMOS non-annular transistor according to the present invention, also showing a portion of a vertical color filter active pixel sensor.

Referring now to FIG. 4, a cross-sectional diagram shows an illustrative isolated high voltage p-type DMOS non-annular transistor according to the present invention. The cross section shown in FIG. 4 is substantially similar to the cross section of FIG. 2 in many respects.

Persons of ordinary skill in the art will observe that n-well 58 is coupled to buried layer 14 using a set of deep plugs 34 disposed within first epitaxial layer 16 and a diffusion region 44. When the transistor of the present invention is used with a vertical color filter detector array like that shown in FIG. 1, n-type region 44 may be formed using the same mask used to form the green detector 20 of FIG. 1.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An isolated high-voltage p-type DMOS transistor comprising:
   a layer of p-type semiconductor material;
   an n-well disposed in said layer of p-type semiconductor material, said n-well disposed at an axis of symmetry;
   a first annular p-type region disposed in said n-well about said axis of symmetry, said first annular region forming the source of said transistor;
   an annular shallow trench isolation region disposed in said layer of p-type semiconductor material about said axis of symmetry and spaced apart from an outer perimeter of said first annular p-type region, a distance between an inner perimeter of said shallow trench isolation region and an outer perimeter of said first annular p-type region defining a channel length of the transistor;
   an annular p-well region disposed in said layer of p-type semiconductor material about said axis of symmetry and spaced apart from said inner perimeter of said shallow trench isolation region, an inner perimeter of said annular p-well region disposed outside of said inner perimeter of said annular shallow trench isolation region at a distance such that lateral diffusion of impurity atoms in said p-well begins to increase a surface impurity concentration in said layer of p-type semiconductor material at said inner periphery of said shallow trench isolation region;
   a second annular p-type region disposed in said p-well about said axis of symmetry and outside of said outer perimeter of said shallow trench isolation region, said second annular p-type region forming drain of said transistor; and
   an annular gate disposed above and insulated from said layer of p-type semiconductor material, said gate having an inner perimeter aligned with said outer perimeter of said first annular p-type region and an outer perimeter disposed over said shallow trench isolation region.

2. The isolated high-voltage p-type DMOS transistor of claim 1 wherein said layer of p-type semiconductor material is an epitaxial layer disposed on a semiconductor substrate.

3. The isolated high-voltage p-type DMOS transistor of claim 1, further including an annular border shallow trench isolation region having an inner periphery lying outside of an outer periphery of said second annular p-type region.

4. The isolated high-voltage p-type DMOS transistor of claim 1 wherein said layer of p-type semiconductor material further includes at least one photodiode detector disposed therein.

5. The isolated high-voltage p-type DMOS transistor of claim 1 further including an annular border shallow trench isolation region having an inner periphery lying outside of an outer periphery of said second annular p-type region and wherein said layer of p-type semiconductor material is an epitaxial layer disposed on a semiconductor substrate and further wherein said layer of p-type semiconductor material further includes at least one photodiode detector disposed therein.

6. The isolated high-voltage p-type DMOS transistor of claim 1 further including an annular border shallow trench isolation region having an inner periphery lying outside of an outer periphery of said second annular p-type region and wherein said layer of p-type semiconductor material is a second epitaxial layer disposed on first epitaxial layer on a semiconductor substrate and further wherein said substrate, said first epitaxial layer and said second epitaxial layer each include at least one photodiode detector disposed therein.

7. An isolated high-voltage p-type DMOS transistor comprising:
   a layer of p-type semiconductor material;
   an n-well disposed in said layer of p-type semiconductor material;
   a first p-type region disposed in said n-well and forming the source of said transistor;
   a shallow trench isolation region disposed in said layer of p-type semiconductor material and having a first edge spaced apart from said first p-type region, a distance between said shallow trench isolation region and said first p-type region defining a channel length of the transistor;
   a p-well region disposed in said layer of p-type semiconductor material at a location partially coextensive with said shallow trench isolation region and having a first edge spaced further away from said p-type region than said first edge of said shallow trench isolation region, said first edge of said p-well region separated from said first edge of said first p-type region by a distance such that lateral diffusion of impurity atoms in said p-well begins to increase a surface impurity concentration in said layer of p-type semiconductor material at said first edge of said shallow trench isolation region;
   a second p-type region disposed in said p-well beyond a second edge of said shallow trench isolation region, said second annular p-type region forming drain of said transistor; and
   a gate disposed above and insulated from said layer of p-type semiconductor material, said gate having a first edge aligned with said first annular p-type region and extending over said shallow trench isolation region.

* * * * *